(12) United States Patent
Kim et al.

(10) Patent No.: US 10,615,389 B2
(45) Date of Patent: Apr. 7, 2020

(54) SEPARATOR FOR SECONDARY BATTERY HAVING HYDROPHOBIC SURFACE AND METHOD OF PREPARING SAME

(71) Applicants: SK Innovation Co., Ltd., Seoul (KR); SK IE TECHNOLOGY CO., LTD., Seoul (KR)

(72) Inventors: Hye Jin Kim, Daejeon (KR); Won Sub Kwack, Daejeon (KR); Min Sang Park, Daejeon (KR)

(73) Assignees: SK Innovation Co., Ltd., Seoul (KR); SK IE TECHNOLOGY CO., LTD., Seoul (KR)

(*) Notice: Subject to any disclaimer, the term of this patent is extended or adjusted under 35 U.S.C. 154(b) by 307 days.

(21) Appl. No.: 15/331,101

(22) Filed: Oct. 21, 2016

(65) Prior Publication Data
US 2017/0117523 A1    Apr. 27, 2017

(30) Foreign Application Priority Data
Oct. 23, 2015  (KR) .................. 10-2015-0148155

(51) Int. Cl.
H01M 2/00 (2006.01)
H01M 2/16 (2006.01)
(Continued)

(52) U.S. Cl.
CPC ......... *H01M 2/1653* (2013.01); *C23C 16/403* (2013.01); *C23C 16/45536* (2013.01);
(Continued)

(58) Field of Classification Search
CPC . C23C 16/403; C23C 16/45536; C23C 16/02; H01M 2/145; H01M 2/1653; H01M 2/166; H01M 10/0525; H01M 2/1686
See application file for complete search history.

(56) References Cited

U.S. PATENT DOCUMENTS

| | | | | |
|---|---|---|---|---|
| 2004/0114309 | A1* | 6/2004 | Iwaida | H01G 9/058 361/508 |
| 2005/0255769 | A1* | 11/2005 | Henninge | D06M 11/45 442/59 |
| 2015/0345018 | A1* | 12/2015 | Detavernier | C23C 16/403 428/422 |

FOREIGN PATENT DOCUMENTS

| | | |
|---|---|---|
| JP | 2012-181921 A2 † | 9/2012 |
| JP | 2012181921 | 9/2012 |

(Continued)

OTHER PUBLICATIONS

Cari F Hermann et al.; Conformal hydrophobic coatings prepared using atomic layer deposition seed layers and non-chlorinated hydrophobic precursors, V. 15 (2005) pp. 1-8; Journal of Micromechanics and Microengineering.†

*Primary Examiner* — Cynthia H Kelly
*Assistant Examiner* — Monique M Wills
(74) *Attorney, Agent, or Firm* — IP & T Group LLP

(57) ABSTRACT

A separator for a secondary battery includes a porous polymer sheet having a first surface, a second surface opposing the first surface, and a plurality of pores connecting the first surface to the second surface; and heat-resistant inorganic layers formed on at least one of the first surface or the second surface of the porous polymer sheet and on internal surfaces of the pores using an atomic layer deposition (ALD) process. The at least one of the first surface or the second surface and the internal surfaces of the pores have hydrophobically coated hydrophobic layers having hydrophobic functional groups on the heat-resistant inorganic layers.

7 Claims, 3 Drawing Sheets

(51) Int. Cl.
*C23C 16/40* (2006.01)
*C23C 16/455* (2006.01)
*H01M 2/14* (2006.01)
*H01M 10/0525* (2010.01)

(52) U.S. Cl.
CPC ........... *H01M 2/145* (2013.01); *H01M 2/166* (2013.01); *H01M 10/0525* (2013.01)

(56) References Cited

FOREIGN PATENT DOCUMENTS

| | | | |
|---|---|---|---|
| JP | 2013-089323 | A2 † | 5/2013 |
| JP | 2014026946 | | 2/2014 |
| KR | 101223081 | | 1/2013 |
| KR | 1020140003429 | | 1/2014 |
| KR | 101358761 | | 2/2014 |
| KR | 1572105 | B1 † | 12/2015 |

\* cited by examiner
† cited by third party

SEPARATOR FOR SECONDARY BATTERY HAVING HYDROPHOBIC SURFACE AND METHOD OF PREPARING SAME

CROSS-REFERENCE TO RELATED APPLICATION

This application claims the benefit of priority to Korean Patent Application No. 10-2015-0148155, filed on Oct. 23, 2015 with the Korean Intellectual Property Office, the entirety of which is incorporated herein by reference.

BACKGROUND

The present disclosure relates to a separator for a secondary battery and a method of preparing the same, and more particularly, to a separator for a secondary battery having a hydrophobically-treated surface and a method of preparing the same.

Lithium ion secondary batteries commonly include anodes having composite lithium oxides, cathodes having materials capable of the absorption and emission of lithium ions, as well as separators and non-aqueous electrolyte solutions interposed between the anodes and the cathodes. Such lithium ion secondary batteries are formed of electrodes having such anodes, cathodes, and separators interposed therebetween, and stacked on each other, or electrodes having a columnar shape, and wound after the stacking of the electrodes.

The separators function to electrically insulate the anodes from the cathodes, and to support the non-aqueous electrolyte solutions. Porous polyolefin is commonly used to form the separators of such lithium ion secondary batteries. Porous polyolefin has excellent electrical insulating properties and ion transmitting properties, and is widely used in the separators of lithium ion secondary batteries or those of condensers.

Since lithium ion secondary batteries have a high output density and a high capacity density, but include non-aqueous electrolyte solutions, for example, organic solvents, such non-aqueous electrolyte solutions are decomposed by heat generated in an abnormal state, such as a short circuit or overcharging, and in worst case scenarios, may ignite. In order to address these issues, lithium ion secondary batteries have several safety functions, one such safety function being a separator shutdown function.

The separator shutdown function is provided such that the pores of separators are occluded by thermally molten resin materials when lithium ion secondary batteries generate abnormal heat, so as to suppress ionic conduction in the non-aqueous electrolyte solutions, thereby stopping the progress of electrochemical reactions.

In general, it is known that as a shutdown temperature is low, the safety of lithium ion secondary batteries is high. One reason why polyethylene is used as a components of separators is that polyethylene has a moderate shutdown temperature. As such separators, for example, uni-axially or bi-axially stretched resin films are used to porosify the separators and increase the strength thereof.

However, when separators are shut down, the membranes of the separators themselves can be shrunk, and anodes and cathodes may come into contact with each other to cause a secondary problem, such as an internal short circuit. Thus, there is a need for improving the safety of lithium ion secondary batteries by reducing the thermal contraction of separators by increasing the heat resistance thereof.

In order to solve problems, such as an internal short circuit and the like caused by such shrunk membranes, stacking layers, for example, porous layers, containing non-conductive particles such as inorganic particles on polyolefin-based organic separators or on electrodes, for example, positive or negative electrodes, has been proposed. Also, disclosed is a separator having an inorganic oxide layer deposited on the surface of a porous polyolefin-based substrate and on the internal surfaces of pores thereof using atomic layer deposition (ALD) (Japanese Patent Publication No. 2012-181921).

However, when porous layers are formed on porous substrates such as polyolefin substrates, the porous layers are formed using wet processes. Since inorganic substances included in separators have hydrophilicity, it is easy for a large amount of water to be included in the pores of the separators. Such water may have a negative influence on lithium ion secondary batteries, and may result in problems such as generating gas through a reaction with electrolytes or significantly reducing the lifespan of lithium ion secondary batteries by allowing lithium ions to be used due to the water.

Thus, separators are required to maintain their water contents in order to reliably exhibit excellent lifespan properties. Also, disclosed are a technology of introducing a functional group to inorganic particles (Korean Patent Publication No. 2014-0003429), a technology of introducing a surface modifier to inorganic particles (Korean Patent No. 1223081), a technology of coating the surface of inorganic particles with a coupling agent (Korean Patent No. 1358761), and a technology of introducing a layer including polyvinylidene fluoride (PVDF) to the surface of a separator (Japanese Patent Publication No. 2014-026946), in order for the water contents of separators to remain low.

SUMMARY

An aspect of the present disclosure may provide a separator for a secondary battery having a hydrophobic surface, which may increase the lifespan of the secondary battery and enable operational reliability of the secondary battery by reducing the water content of the separator manufactured using an atomic layer deposition (ALD) process for forming inorganic hydrophilic oxides on the internal surfaces of pores of the separator, and a method of preparing the same.

According to an aspect of the present disclosure, a separator for a secondary battery may include: a porous polymer sheet having a first surface, a second surface opposing the first surface, and a plurality of pores connecting the first surface to the second surface; and heat-resistant inorganic layers formed on at least one of the first surface or the second surface of the porous polymer sheet and on internal surfaces of the pores using an atomic layer deposition (ALD) process, in which the at least one of the first surface or the second surface and the internal surfaces of the pores may have hydrophobically coated hydrophobic layers having hydrophobic functional groups on the heat-resistant inorganic layers, and the hydrophobic layers may have contact angles greater than contact angles of the heat-resistant inorganic layers.

The hydrophobic functional group may be at least one selected from the group consisting of fluorine or silane.

The separator having the hydrophobically coated layers may have a water content of 3,000 ppm or lower.

Each of the heat-resistant inorganic layers may include a molecule including an atom of at least one metallic element selected from the group consisting of aluminum, calcium, magnesium, silicon, titanium, or zirconium, and an atom of at least one nonmetallic element selected from the group consisting of carbon, nitrogen, sulfur, or oxygen.

Each of the heat-resistant inorganic layers may have a thickness of 1 nm to 50 nm.

The heat-resistant inorganic layers may be formed as portions of the internal surfaces of the pores. A thickness of each of the heat-resistant inorganic layers formed on the internal surfaces of the pores may be less than a thickness of each of the heat-resistant inorganic layers formed on the first surface or the second surface of the porous polymer sheet.

According to another aspect of the present disclosure, a method of preparing a separator for a secondary battery having a hydrophobic surface may include: forming heat-resistant inorganic layers on a first surface and a second surface of a porous polymer sheet and on internal surfaces of a plurality of pores of the porous polymer sheet using an atomic layer deposition process by alternately supplying a metallic compound and a nonmetallic compound to the porous polymer sheet in vapor phases, the porous polymer sheet having the first surface, the second surface opposing the first surface, and the pores connecting the first surface to the second surface; and hydrophobically treating the heat-resistant inorganic layers formed on at least one of the first surface or the second surface and on the internal surfaces of the pores using the atomic layer deposition process by supplying precursors having hydrophobic functional groups to the heat-resistant inorganic layers.

Each of the hydrophobic functional groups may be at least one selected from the group consisting of fluorine or silane. Each of the precursors having the hydrophobic functional groups may be selected from the group consisting of: C1 to C20 fluorinated hydrocarbons having at least one leaving group selected from halogen, amine, and alkoxy groups; at least one silane compound selected from the group consisting of n-octadecyltrichlorosilane, tridecafluor-1,1,2,2-tetra-hydrooctyl triethoxysilane, or hexamethylsilazane; or a fluorine-containing process gas represented by Formula: $CFR1=CR2R3$, in which each of R1, R2, and R3 may be C1 to C10 hydrocarbons having a fluorine atom or monovalent fluorine independently of one another, or at least two of R1, R2, and R3 are C1 to C10 hydrocarbons having bivalent fluorine, and the remainder of R1, R2, and R3 is a C1 to C10 hydrocarbon having a fluorine atom or monovalent fluorine.

The introducing of the hydrophobic functional groups may be performed using the atomic layer deposition process. The atomic layer deposition process introducing the hydrophobic functional groups may be performed a number of times.

According to another aspect of the present disclosure, a method of preparing a separator for a secondary battery having a hydrophobic surface may include: forming heat-resistant inorganic layers on a first surface and a second surface of a porous polymer sheet and on internal surfaces of a plurality of pores of the porous polymer sheet using an atomic layer deposition process by alternately supplying a metallic compound and a nonmetallic compound to the porous polymer sheet in vapor phases, the porous polymer sheet having the first surface, the second surface opposing the first surface, and the pores connecting the first surface to the second surface; and forming hydrophobic layers on the heat-resistant inorganic layers formed on at least one of the first surface or the second surface and on the internal surfaces of the pores by applying energy to the separator for the secondary battery, such that precursors of hydrophobic compounds are supplied to and adsorbed onto the heat-resistant inorganic layers, and by growing thin films on the heat-resistant inorganic layers through surface reaction with a reaction gas.

Each of the heat-resistant inorganic layers may include at least one selected from inorganic metal oxides including an aluminum oxide, a silicon oxide, a titanium oxide, or a zinc oxide.

The heat-resistant inorganic layers may be formed by supplying, depositing, and purging a metallic compound vapor and supplying, depositing, and purging a nonmetallic compound vapor, repeatedly.

The porous polymer sheet may have a core able to react with the metallic compound. The core able to react with the metallic compound may be at least one functional group selected from the group consisting of a hydroxy group or an amine group. The core able to react with the metallic compound may be generated by a plasma treatment or a corona treatment.

The nonmetallic compound may include at least one selected from the group consisting of carbon, nitrogen, sulfur, and oxygen, and may have a functional group able to react with the metallic compound.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
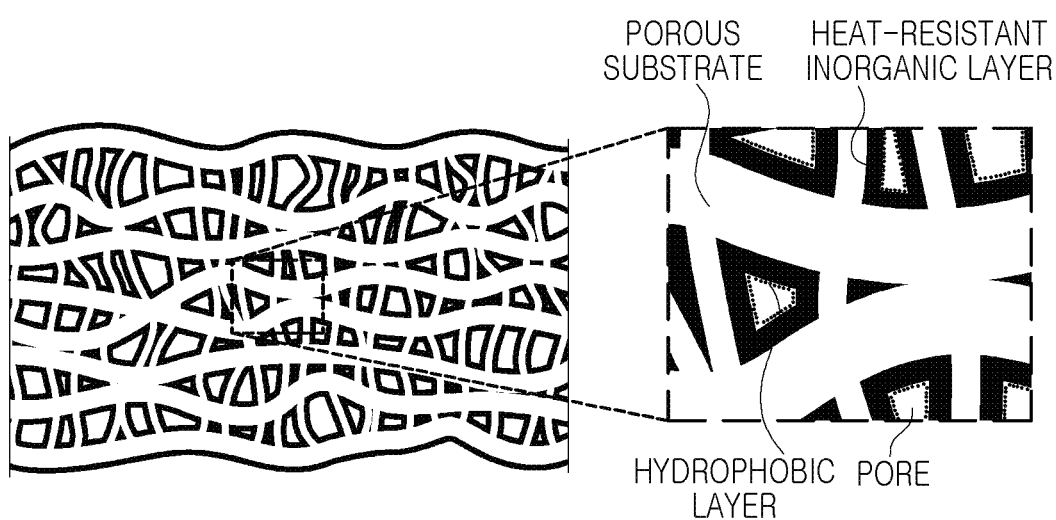
FIG. 1 is a diagram of a cross section of a separator having a heat-resistant inorganic layer formed on a surface of a porous substrate, and a hydrophobically-treated hydrophobic layer formed on the heat-resistant inorganic layer.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and only a required configuration is proposed herein, but the present disclosure is not limited thereto.

The present inventors have identified that when a separator for a secondary battery is manufactured by forming a heat-resistant coating layer on a surface of a porous sheet, using an atomic layer deposition (ALD) process, a surface of the separator may be hydrophobized using the ALD process, thus significantly reducing a water content of the separator, and have completed the present disclosure.

A separator, according to an embodiment, may include a heat-resistant inorganic layer formed using an ALD process on a surface of a porous sheet.

A separator, according to an embodiment, functions to prevent a short circuit from occurring and to allow ions to pass therethrough by separating an anode from a cathode, so that the anode comes into contact with the cathode, and the separator is formed using a porous substrate that includes a material having excellent strength. The porous substrate may be suitably used in an embodiment as long as the porous substrate is a porous polymer sheet having a first surface, a second surface opposing the first surface, and a plurality of pores connecting the first surface to the second surface.

For example, the porous material may be a typical insulating resin material having a high degree of ion transmittance and mechanical strength. As such a resin material, for example, a polyolefin-based synthetic resin such as polypropylene (PP) or polyethylene (PE), an acrylic resin, a styrene resin, a polyester resin, or a polyamide-based resin, may be used. Among these resin materials, a polyolefin-based porous sheet exhibits excellent electrical insulating properties and ion transmittance to thus be widely used as a separator for a secondary battery.

The polyolefin-based porous sheet is not particularly limited to the above resin materials, and may be, for example, polyethylene such as high-density polyethylene, low-density polyethylene, linear low-density polyethylene, or high molecular polyethylene, polypropylene, polypropyleneterephthalate, polyethyleneterephthalate, polybutyleneterephthalate, polyester, polyacetal, polyamide, polycarbonate, polyimide, polyamideimide, polyetherimide, polyetheretherketone, polyethersulfone, polyphenyleneoxide, polyphenylenesulfide, or polyethylenenaphthalate.

Since the secondary battery has a high output density and a high capacity density, but includes a non-aqueous electrolyte solution, for example, an organic solvent, the non-aqueous electrolyte solution may be decomposed by heat generated in an abnormal state of the secondary battery such as a short circuit or overcharging, and in a worst case scenario may ignite.

In order to prevent such a phenomenon, a shutdown function is required in the case that the pores of the separator are clogged by being thermally molten near the melting point of the resin material when the second battery abnormally generates heat, resulting in breaking a current. In general, as a shutdown temperature is low, the safety of the second battery is high, and the polyolefin-based resin material as described above has a moderate shutdown temperature, and may be suitably used as the separator for the second battery. Use of the polyolefin-based porous sheet may allow separation between the anode and the cathode to be excellent, thus further reducing the number of internal short circuits or a level of an open circuit voltage.

The above-mentioned polyolefin-based resin material is desirable in terms of the shutdown function, but when the shutdown function is performed, the separator is shrunk so that the anode and the cathode come into contact with each other. As a result, a secondary problem, such as an internal short circuit, may occur. Thus, there is a need for improving the safety of the second battery by reducing the thermal contraction of the separator by increasing the heat resistance of the separator formed of the polyolefin-based resin material.

Hence, in order to suppress the separator according to an embodiment from being shrunk by increasing the heat resistance of the porous substrate formed of the polyolefin-based resin, the separator may include the heat-resistant inorganic layers formed on the surface of the porous substrate, for example, one or both surfaces thereof, and on the internal surfaces of the pores.

The heat-resistant inorganic layers are formed of, for example, a material having a higher degree of heat resistance than a material forming the porous substrate. These heat-resistant inorganic layers may include, for example, a molecule including an atom of at least one metallic element selected from the group consisting of aluminum, calcium, magnesium, silicon, titanium, or zirconium, and an atom of at least one nonmetallic element selected from the group consisting of carbon, nitrogen, sulfur, or oxygen. In more detail, the heat-resistant inorganic layers are formed of at least one ceramic selected from an aluminum oxide, a silicon oxide, a titanium oxide, or a zinc oxide.

The heat-resistant inorganic layers are formed, for example, on the surface of the porous substrate, for example, one or both surfaces thereof, as well as on the internal surfaces of the pores of the porous substrate, as illustrated in FIG. 1. The heat-resistant inorganic layers are formed on the surface of the porous substrate to suppress the separator from being shrunk under an abnormal high-temperature environment. The heat-resistant inorganic layers are also formed on the internal surfaces of the pores to further increase the heat resistance of the separator, as compared to a case in which the heat-resistant inorganic layer is only formed on the surface of the substrate. For example, the heat-resistant coating layers having good wettability with a non-aqueous electrolyte solution are also formed on the internal surfaces of the pores to further increase the affinity of an electrolyte with respect to the pores.

According to an embodiment, the heat-resistant inorganic layers formed on the internal surfaces of the pores are formed on portions of the internal surfaces of the pores. As such, the shutdown function, by which the pores of the separator are clogged by being thermally molten near the melting point of the resin material when the second battery abnormally generates heat, resulting in breaking a current, may be effectively exhibited, and the heat-resistant inorganic layers formed on the surface of the separator and on the internal surfaces of the pores may be connected to each other in a network structure to suppress the separator from being shrunk.

The heat-resistant inorganic layers of the porous substrate are formed using the ALD process. By forming the heat-resistant inorganic layers using the ALD process, the heat-resistant inorganic layers are formed on the surface of the substrate and on the internal surfaces of the pores.

The formation of the heat-resistant inorganic layers on the surface of the porous substrate is not particularly limited, and a common ALD method may be applied to the formation. In detail, a metallic compound vapor is supplied to a first surface and a second surface of a porous polymer sheet (hereinafter, referred to as a substrate) and on internal surfaces of a plurality of pores of the porous polymer sheet, and the porous polymer sheet has the first surface, the second surface opposing the first surface, and the pores connecting the first surface to the second surface. Thus, a metallic compound is formed on the surface of the substrate through a reaction between the substrate and the metallic compound vapor.

For the reaction with the metallic compound, a functional group able to react with the metallic compound is initially formed as a core on the surface of the substrate. The functional group as the core is not particularly limited, and may be a hydroxy group or an amine group. Such a functional group forms the surface of the substrate, using a method, such as a plasma treatment, a corona treatment, or an ultraviolet (UV) radiation treatment. For example, a hydroxy group is formed on the surface of the substrate and on the internal surfaces of the pores by treating a polyolefin-based porous substrate with peroxide or hydrogen plasma.

A metallic compound as a precursor including a metal is supplied to the substrate having the above-mentioned functional group formed thereon. The metallic compound as the precursor including the metal is not particularly limited as long as the metallic compound is a metal able to provide heat resistance, and may be, for example, at least one selected from the group consisting of aluminum, calcium, magnesium, silicon, titanium, or zirconium. In detail, the metallic compound may be selected from the group consisting of $AlCl_3$, tri-methyl-aluminum (TMA), $Al(CH_3)_2Cl$, $Al(C_2H_5)_3$, $Al(OC_2H_5)_3$, $Al(N(C_2H_5)_2)_3$, $Al(N(CH_3)_2)_3$, $SiCl_4$, $SiCl_2H_2$, $Si_2Cl_6$, $Si(C_2H_5)H_2$, $Si_2H_6$, $TiF_4$, $TiCl_4$, $TiI_4$, $Ti(OCH_3)_4$, $Ti(OC_2H_5)_4$, $Ti(N(CH_3)_2)_4$, $Ti(N(C_2H_5)_2)_4$, $Ti(N(CH_3)(C_2H_5))_4$, $VOCl_3$, $Zn$, $ZnCl_2$, $Zn(CH_3)_2$, $Zn(C_2H_5)_2$, $ZnI_2$, $ZrCl_4$, $ZrI_4$, $Zr(N(CH_3)_2)_4$, $Zr(N(C_2H_5)_2)_4$, $Zr(N(CH_3)(C_2H_5))_4$, $HfCl_4$, $HfI_4$, $Hf(NO_3)_4$, $Hf(N(CH_3)(C_2H_5))_4$, $Hf(N(CH_3)_2)_4$, $Hf(N(C_2H_5)_2)_4$, $TaCl_5$, $TaF_5$, $TaI_5$, $Ta(O(C_2H_5))_5$, $Ta(N(CH_3)_2)_5$, $Ta(N(C_2H_5)_2)_5$, or $TaBr_5$, but is not limited thereto.

In detail, when TMA is supplied to the substrate having the hydroxy group formed thereon, TMA reacts with the hydroxy group, so that dimethylaluminum groups are combined with oxygen on the surface of the substrate and on the internal surfaces of the pores Thus, methane is generated as a byproduct.

Subsequently, after removing the byproduct generated by the reaction between the functional group and the metallic compound vapor, supplied by the adhesion of the metallic compound, a nonmetallic compound is supplied to the substrate in a vapor phase. Such a nonmetallic compound reacts with the metallic compound on the substrate to form a heat-resistant inorganic layer.

The nonmetallic compound is not particularly limited as long as the nonmetallic compound combines with the above-mentioned metals to form a heat-resistant inorganic layer, and may be a compound including at least one element selected from the group consisting of carbon, nitrogen, sulfur, and oxygen. The nonmetallic compound may be, for example, water, oxygen, ozone, hydrogen peroxide, alcohol, $NO_2$, $N_2O$, $NH_3$, $N_2$, $N_2H_4$, $C_2H_4$, $HCOOH$, $CH_3COOH$, $H_2S$, $(C_2H_5)_2S_2$, $N_2O$ plasma, hydrogen plasma, oxygen plasma, $CO_2$ plasma, or $NH_3$ plasma, and may also form, for example, the same functional group as that formed on the surface of the substrate.

In detail, the nonmetallic compound may be water vapor, and the water vapor reacts with the dimethylaluminum group on the surface of the substrate to form an aluminum oxide, and methane as a byproduct.

Such an ALD process allows monomolecular layers of alumina to be formed on the surface of the substrate and on the internal surfaces of the pores. Each of the monomolecular layers, formed using the ALD process, has an A thickness, and repetition of the ALD process allows heat-resistant inorganic layers having a thickness to be formed.

The heat-resistant inorganic layers, formed using the ALD process, are not particularly limited, and have, for example, a thickness of 10 nm to 50 nm. The thickness of the heat-resistant inorganic layers formed on the internal surfaces of the pores may be less than a thickness of the heat-resistant inorganic layer formed on the first surface or the second surface of the porous polymer sheet.

An inorganic compound, formed on the surface of the substrate to provide heat resistance, has good affinity with water, and in particular, when heat-resistant inorganic layers are formed using the ALD process, the heat-resistant inorganic layers are formed to the internal surfaces of the pores so as to allow the separator to have water therein. Such water may negatively influence the secondary battery, by generating gas by reacting with an electrolyte during a cell reaction or significantly reducing the life cycle of the secondary battery or by allowing ions to be consumed due to the presence of the water. Thus, the separator may not, for example, contain water.

As a result, as illustrated in FIG. 1, the heat-resistant inorganic layers may be, for example, hydrophobically-treated using a hydrophobic functional group. Such a hydrophobic functional group is applied to, for example, the surface of the substrate and the internal surfaces of the pores.

The term "hydrophobicity" used herein refers to having hydrophobicity relatively larger than that of the heat-resistant inorganic layer, formed on the surface of the porous polymer sheet, using the ALD process, for example, to having a contact angle greater than that of the heat-resistant inorganic layer. For example, a hydrophobic layer formed by the hydrophobic treatment may have a contact angle great than or equal to 45°, further, a contact angle between 60° and 130°.

In order to apply hydrophobic functional groups to the internal surfaces of the pores, the present disclosure provides a method of applying, in a vapor phase, a precursor compound having a hydrophobic functional group on a heat-resistant inorganic layer formed using the ALD process to form the hydrophobic group thereon using the ALD process, thus hydrophobically treating the heat-resistant inorganic layer.

This is to perform the hydrophobic treatment repeating the ALD process applied to form the heat-resistant inorganic layer, so that a separate treatment is not needed and the hydrophobic group is applied to the internal surfaces of the pores, thus significantly reducing the water content of the separator. Further, the hydrophobic layer, formed by the above process, forms a hydrophobizing layer having a reduced Å thickness.

The precursor compound introduced for the hydrophobic treatment, has a hydrophobic functional group, and may be at least one selected from the group consisting of fluorine and silane. The precursor compound having such a hydrophobic functional group may include a leaving group, such as a halogen, amine, or an alkoxy group, and may include at least one compound having a hydrophobic functional group selected from the group consisting of fluorinated hydrocarbon and silane.

For example, such a precursor compound is not limited thereto, and the precursor compound may be n-octadecylchlorosilane, tridecafluoro-1,1,2,2-tetrahydrooctyltriethoxysilane, hexamethylsilazane, alkylsilane such as Formula 1,

(1)

alkoxide silane represented by Formulas 2 to 8,

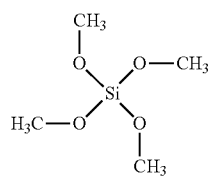

(2)

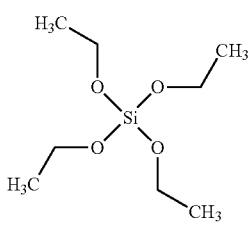

(3)

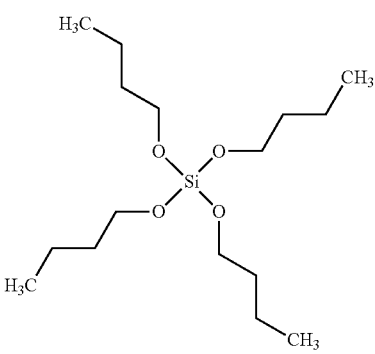

(4)

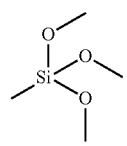

(5)

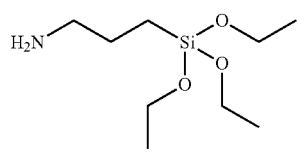

(6)

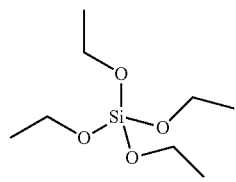

(7)

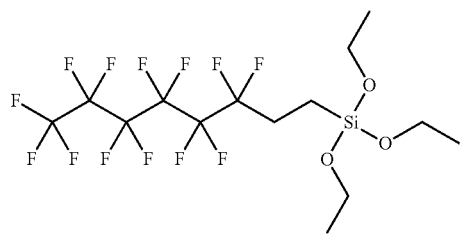

(8)

halide silane represented by Formulas 9 and 10, (9)

(10)

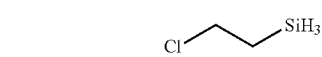

alkoxide silane represented by Formulas 11 to 14,

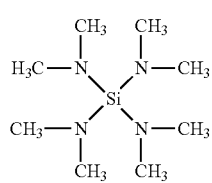 (11)

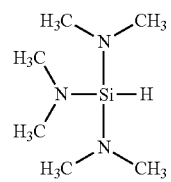 (12)

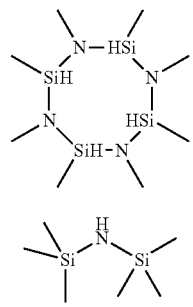 (13)

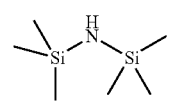 (14)

or siloxane represented by Formula 15.

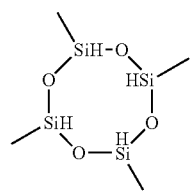 (15)

Further, a precursor compound having another hydrophobic functional group may be a process gas including fluorine, is not limited thereto, and may be a process gas represented by, for example, $CFR_1=CR_2R_3$, in which $R_1$, $R_2$ and $R_3$ are organic groups having fluorine atoms or monovalent fluorine independently of one another, or at least two of $R_1$, $R_2$ and $R_3$ are organic groups having bivalent fluorine, and the remainder of $R_1$, $R_2$ and $R_3$ is an organic group having a fluorine atom or monovalent fluorine.

By performing the hydrophobic treatment using such a precursor compound, the heat-resistant inorganic layers having hydrophobic surfaces are formed on the surface of the substrate and on the internal surfaces of the pores, and the hydrophobic surfaces include at least one compound having a hydrophobic functional group selected from the group consisting of n-octadecylsilane, tridecafluoro-1,1,2,2-tetrahydrooctylsilane, hexamethylsilazane, trimethylsilane, polyvinylidene fluoride (PVDF), fluorinated hydrocarbon such as Teflon, or silane.

The hydrophobic treatment using such an ALD process may be performed a number of times such that a hydrophobic coating layer has a degree of thickness suitable to provide hydrophobicity.

The separator using the hydrophobic coating layer may have, for example, a water content of 3,000 ppm or lower.

EXAMPLES

Hereinafter, the present disclosure will be described in more detail with reference to the following Examples. However, these Examples are for illustrative purposes only, and the invention is not intended to be limited by these Examples.

Example 1

In order to manufacture a polyolefin-based microporous layer, high-density polyethylene having a weight average molecular weight of $3.8 \times 10^5$ was used, a 1:2 mixture of dibutylphthalate and paraffin oil having a kinematic viscosity of 160 cSt at 40° C. was used as diluent, and the contents of the high-density polyethylene and the diluent were 30 wt % and 70 wt %, respectively.

The above composition was extruded at 240° C. using a twin-shaft compounder having a T-die, passed through a section set to 180° C. to cause phase separation, and was manufactured to form a sheet using a casting roll. The sheet was manufactured by sequential biaxial stretching at a stretching ratio (7.5 times in MD and TD, respectively) and a stretching temperature of 131° C. Here, a heat setting temperature was 130° C., and a heat setting width was 1.1-1.3-1.1.

Physical properties of a manufactured separator were measured, a final thickness of the separator was 25 μm, gas permeability (Gurley number) thereof was 100 sec., a pore size thereof was 22 nm, and a thermal contraction thereof at 130° C. was 25% and 28% in the longitudinal and transverse directions of the separator, respectively.

The porous polymer sheet was treated under conditions of 1.9 kW, a slit distance between the porous polymer sheet and plasma of 3 mm, a plasma slit gap of 2 mm, a line speed of 10 m/min, using in-line oxygen plasma equipment.

The plasma-treated porous polymer sheet was mounted within a chamber set to 100° C. Trimethylaluminum (Al $(CH_3)_3$), argon (Ar), water ($H_2O$), and argon (Ar) were sequentially applied to the surface of the porous polymer sheet at exposure times of 1, 5, 3, 15 seconds, and this process was repeated 92 number of times to form an aluminum oxide ($Al_2O_3$) layer, that is, a heat-resistant layer.

Immediately after the formation of the aluminum oxide layer, tridecafluoro-1,1,2,2-tetrahydrooctylsilane was applied to the heat-resistant layer for 5 minutes to form a final hydrophobic layer.

The characteristics of an obtained separator were estimated as illustrated in Table 1 below.

Example 2

After the aluminum oxide layer forming process repeated 92 number of times was completed in Example 1, tridecafluoro-1,1,2,2-tetrahydrooctylsilane was applied to the porous polymer sheet having the heat-resistant layer for 20 minutes in the same manner as Example 1, except that a heat-resistant coating layer having the final hydrophobic layer is formed, and thus, a separator having a hydrophobically-treated heat-resistant coating layer was manufactured.

The characteristics of the manufactured separator were estimated as illustrated in Table 1 below.

Comparative Example 1

After the aluminum oxide layer forming process repeated 92 times was completed in Example 1, the porous polymer sheet having the heat-resistant layer was treated in the same manner as Example 1, except that a separate hydrophobic material applying process is performed, and thus, a separator having a heat-resistant coating layer was manufactured.

The characteristics of the manufactured separator were estimated as illustrated in Table 1 below.

Figure 2:
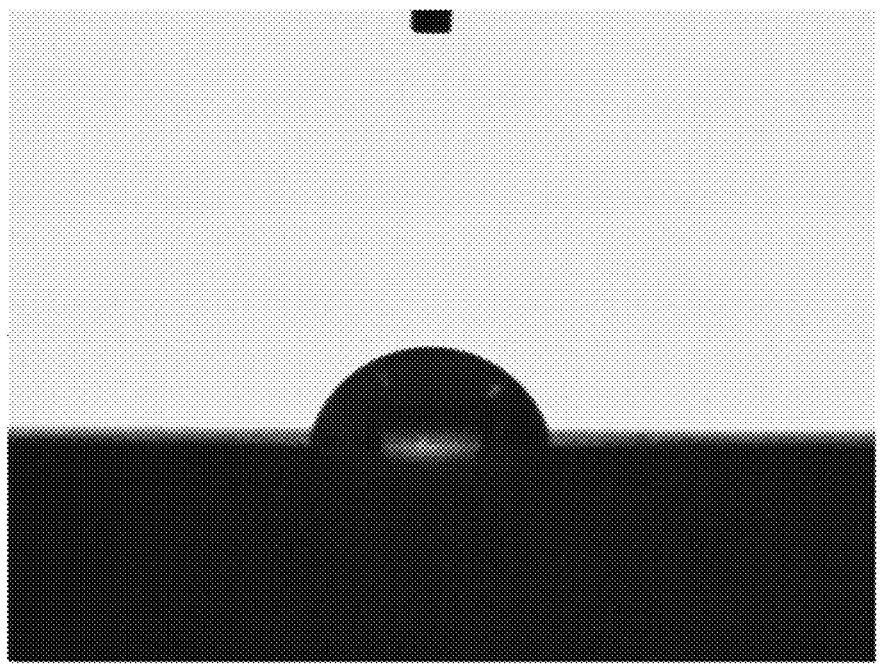
FIGS. 2 through 4 are images of measured contact angles of Example 1, Example 2, and Comparative Example 1.
Figure 3:
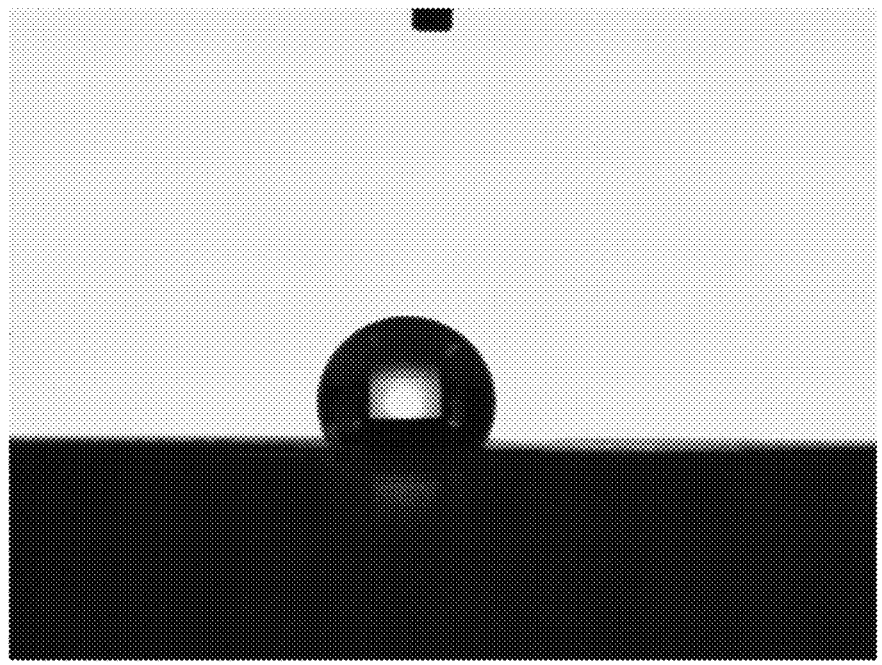
Figure 4:
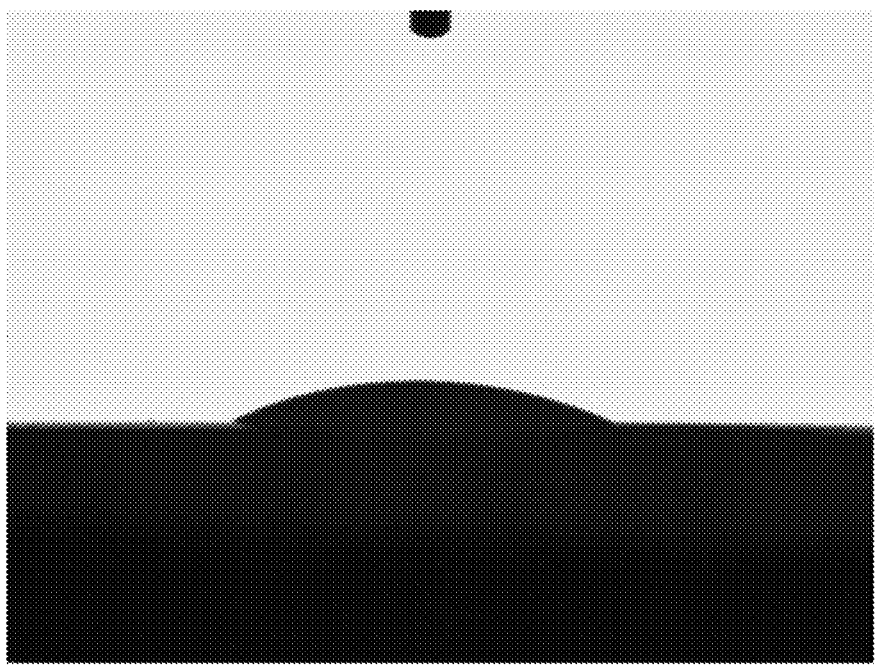

Further, images of measured contact angles of Examples 1 and 2 and Comparative Example 1 are illustrated in FIGS. 2 through 4.

TABLE 1

|  | Example 1 | Example 2 | Comparative Example 1 |
| --- | --- | --- | --- |
| Gas Permeability (sec/100 cc) | 227 | 240 | 236 |
| Deposition Thickness (nm) | 13.95 | 14.10 | 14.02 |
| Contraction (%, MD/TD) | 1.0/5.0 | 1.0/5.0 | 1.0/5.0 |
| Contact angle (°) | 81.0 | 114 | 24.3 |
| Water Content (ppm) | 2799.7 | 2365.0 | 26955 |

Physical properties illustrated in Table 1 were measured by the following method.

(1) Gas Permeability (Gurley Densometer)

Gas permeability indicates a time (sec) required for gas having a volume of 100 ml to pass through an area (line) at a constant pressure of about 1 psig to about 2 psig, and was measured using a Gurley Densometer (Toyo Seiki Seisaku-sho, Ltd.)

(2) Deposition Thickness

The deposition thickness of an inorganic metal compound on a composite microporous layer formed using the ALD process, was replaced with a thickness measured using a reflectometer after the inorganic metal compound is deposited on a silicon (Si) wafer under the same deposition conditions.

(3) Shrinkage

When a Teflon sheet is interposed between glass plates and force of shrinkage of 7.5 mg/mm² is applied to a composite micro-porous layer to be measured, the Teflon sheet, the glass plates, and the composite micro-porous layer remained in an oven set to 200° C. for 1 hour, and the shrinkage thereof was measured in the longitudinal and transverse directions thereof to calculate final area shrinkage (%) thereof.

(4) Contact Angle

The contact angles were measured by dosing deionized (DI) water of 3 µl at a rate of 600 µl/min using a DAS100 contact angle meter drop shape analysis system (Krüss GmbH).

(5) Water Content

A sample for measurement of water content was prepared by measuring a sample of 100 mg to 500 mg after the sample remained in a constant-temperature and constant-humidity chamber set to 60° C. and 90% RH for 24 hours.

The Karl Fischer method was used as a method of determining the content of water contained in the sample, and was based on the following Karl Fischer reaction:

$$H_2O+I_2+[RNH]SO_3CH_3+2RN \rightarrow [RNH]SO_4CH_3+2[RNH]I$$

Using a Metrohm 870 KF Titrino plus and a 756 KF Coulometer, titer was determined with a Fluka HYDRA-NAL®-Water Standard KF-Oven, and the sample was titrated with a Fluka HYDRANAL®-Coulomat AG-Oven to measure the content of water contained in the sample. The content of water was calculated using the preceding Formula, and the calculated content of water was converted into ppm units for display.

$$\frac{\text{Titer value (mg/ml)} \times \text{Consumption of Reagent to Equivalence Point (ml)}}{\text{Amount of Sample}} \times 100 = \text{Water Content (\%)}$$

As set forth above, according to an exemplary embodiment, when the water content of a separator manufactured using an atomic layer deposition (ALD) process increases in a case in which inorganic oxide layers are formed to the internal surfaces of pores of the porous polymer sheet by the ALD process, the water content may be significantly reduced by hydrophobically treating surfaces of the inorganic oxide layers formed on the internal surfaces of the pores, as well as on the surface of the porous polymer sheet.

While exemplary embodiments have been shown and described above, it will be apparent to those skilled in the art that modifications and variations could be made without departing from the scope of the present invention as defined by the appended claims.

What is claimed is:

1. A separator for a secondary battery comprising:
a porous polyolefin polymer sheet having a first surface, a second surface opposing the first surface, and a plurality of pores connecting the first surface to the second surface; and
heat-resistant inorganic layers formed on at least one of the first surface or the second surface of the porous polyolefin polymer sheet and on internal surfaces of the pores using an atomic layer deposition (ALD) process,
wherein the at least one of the first surface or the second surface and the internal surfaces of the pores have hydrophobically coated hydrophobic layers having hydrophobic functional groups on the heat-resistant inorganic layers, and the hydrophobic layers have contact angles greater than contact angles of the heat-resistant inorganic layers.

2. The separator of claim 1, wherein each of the hydrophobic functional groups is at least one selected from the group consisting of fluorine and silane.

3. The separator of claim 1, wherein the separator having the hydrophobically coated layers has a water content of 3,000 ppm or lower.

4. The separator of claim 1, wherein each of the heat-resistant inorganic layers comprises a molecule including an atom of at least one metallic element selected from the group consisting of aluminum, calcium, magnesium, silicon, titanium, or zirconium, and an atom of at least one nonmetallic element selected from the group consisting of carbon, nitrogen, sulfur, or oxygen.

5. The separator of claim 1, wherein each of the heat-resistant inorganic layers has a thickness of 1 nm to 50 nm.

6. The separator of claim 1, wherein a thickness of each of the heat-resistant inorganic layers formed on the internal surfaces of the pores is less than a thickness of each of the heat-resistant inorganic layers formed on the first surface or the second surface of the porous polyolefin polymer sheet.

7. The separator of claim 1, wherein the heat-resistant inorganic layers are formed on portions of the internal surfaces of the pores.

* * * * *